(12) United States Patent
Coombs et al.

(10) Patent No.: US 11,965,800 B1
(45) Date of Patent: Apr. 23, 2024

(54) BREAKOUT BOX FOR TESTING PERISCOPE CABLE CONNECTORS

(71) Applicant: The United States of America as represented by the Secretary of the Navy, Newport, RI (US)

(72) Inventors: James M Coombs, Newport, RI (US); David E Baumgarte, Mystic, CT (US)

(73) Assignee: The United States of America as represented by the Secretary of the Navy

(*) Notice: Subject to any disclaimer, the term of this patent is extended or adjusted under 35 U.S.C. 154(b) by 460 days.

(21) Appl. No.: 17/471,264

(22) Filed: Sep. 10, 2021

Related U.S. Application Data

(60) Provisional application No. 63/211,571, filed on Jun. 17, 2021.

(51) Int. Cl.
| | | |
|---|---|---|
| *G01M 11/00* | (2006.01) | |
| *B63G 8/38* | (2006.01) | |
| *G01R 31/00* | (2006.01) | |
| *G02B 23/08* | (2006.01) | |
| *G02B 23/16* | (2006.01) | |

(52) U.S. Cl.
CPC ....... *G01M 11/3154* (2013.01); *G01R 31/008* (2013.01); *G02B 23/08* (2013.01); *G02B 23/16* (2013.01); *B63G 8/38* (2013.01)

(58) Field of Classification Search
None
See application file for complete search history.

(56) References Cited

U.S. PATENT DOCUMENTS

| | | | | |
|---|---|---|---|---|
| 4,724,287 A | * | 2/1988 | Heng | H01H 19/03 200/14 |
| 4,771,721 A | * | 9/1988 | Pratt | B63G 8/38 114/340 |
| 5,821,869 A | * | 10/1998 | Schweitzer, Jr. | H02H 3/04 116/284 |
| 7,112,969 B1 | * | 9/2006 | Thomas | G01R 31/58 324/503 |
| 2003/0164776 A1 | * | 9/2003 | Knust | B63G 8/38 340/984 |
| 2008/0267554 A1 | * | 10/2008 | Thompson | H01R 4/2433 385/2 |
| 2020/0110114 A1 | * | 4/2020 | Mahoney | G01R 15/16 |

FOREIGN PATENT DOCUMENTS

CN    113514734 A  *  10/2021

* cited by examiner

*Primary Examiner* — Natalie Huls
*Assistant Examiner* — Nyla Gavia
(74) *Attorney, Agent, or Firm* — James M. Kasischke; Michael P. Stanley; Jeffry C. Severson

(57) ABSTRACT

A device for testing the interface to periscope inboard electronics is provided with an enclosure having a cable connector for a plurality of cables from a periscope mast. Each cable includes electric wires, fiber optic lines, radio frequency lines, and video lines. A plurality of interface panels are mounted on the enclosure. Each interface panel is associated with a cable of the plurality of cables. Each interface panel has test points for each voltage conducting cable, video path, and fiber optic line for the associated cable and status indicators for the device and inboard electronics. A multi-position switch is mounted on the enclosure and can be selected for one of a plurality of periscope mast types.

9 Claims, 3 Drawing Sheets

BREAKOUT BOX FOR TESTING PERISCOPE CABLE CONNECTORS

The present application claims the benefit of U.S. Provisional Application Ser. No. 63/211,571 filed on Jun. 17, 2021 and entitled "Breakout Box for Periscope Cable Connector" by the inventors James Coombs and David Baumgarte.

STATEMENT OF GOVERNMENT INTEREST

The invention described herein was made in the performance of official duties by employees of the U.S. Department of the Navy and may be manufactured, used, or licensed by or for the Government of the United States for any governmental purpose without payment of any royalties thereon.

CROSS REFERENCE TO OTHER PATENT APPLICATIONS

None.

BACKGROUND OF THE INVENTION

(1) Field of the Invention

The present invention is directed to a device for verifying the integrity of the inboard electronics by accessing conductors on periscope dip loop cables.

(2) Description of the Related Art

There are specialized outboard electrical cables that link masts or sensors to an outboard electrical hull fitting. These cables can vary in length and complexity within different applications and classes of submarines. As such, a primary importance is to verify that there are no voltages coming from any inboard electronics that could damage a multi-million dollar mast when the mast connects to a specialized dip loop cable. Also, during operations, the outboard cables can develop kinks, fractures, or breaks in some of their conductors, which eventually lead to system failure. A secondary benefit to verification or cable testing is to prevent these problems with outboard conductors.

Close proximity of contacts inside a densely populated connector can short test probes to other pins. Testing usually requires inserting jumper wires and jumpers with resistors between pins with the result of restricting operating space inside the connector. Additionally, fiber optic conductors inside the connector are fragile. Breaking a fiber pin when connecting test equipment requires replacing the dip loop cable.

Currently, cables are only checked for continuity and resistance readings. This method does not detect whether any of the strands in a wire are broken or whether a coaxial conductor is fractured. Broken strands in a wire can cause cable failure. Unless the wire is completely broken, continuity may still be verified.

In order to satisfy the primary importance and objective, a breakout box is needed to improve the process of measuring voltages supplied by inboard electronics and to check the integrity of dip loop fiber optic and radio frequency cables in preparation for a photonics periscope installation.

There is also a continuing need for a device capable of detecting potential failures and predicting the life expectancy of outboard cables that are day in and day out subjected to harsh environments. Periodic inspection of outboard multi-conductor cables to identify potential failures will predict the service life and replace cables before a complete open-circuit failure occurs during at-sea operations.

A non-destructive test set is desired which can pinpoint potential failures in a cable. This unit is preferably handheld for single person use. It is also desired that the unit be ruggedized.

SUMMARY OF THE INVENTION

The present invention is a device that is attachable to a submarine periscope cable and allows access to connector pins by use of a test panel rather than having contact inside the connector.

A presently operationally dip loop cable uses three individual cables connecting a periscope to hull-mounted connectors. The dip loop cable introduces two fiber optic single mode conductors.

According to an aspect of the invention, a breakout box is provided to take voltage readings at the top of the dip loop cable and to verify the integrity of the fiber optic conductors prior to a mast installation. With a mast selector switch, the breakout box can accommodate various mast types. An accompanying faceplate includes test points for copper and fiber optic conductors for each connector.

The breakout box device simultaneously interfaces with the three dip loop connectors and each cable has an associated interface panel. Analog video can be injected through the breakout box to test the video paths. When the selector switch is set to the mast type, jumper wires that identify the mast type and the resistor-jumper connections are established.

According to an exemplary device for testing submarine periscope cables, an enclosure has a cable connector for a plurality of cables from a periscope mast. Each cable includes fiber optic lines, radio frequency (RF) lines, and video lines. A plurality of interface panels are mounted on the enclosure.

Each interface panel is associated with one cable of the plurality of cables. Each interface panel has test points for each voltage conducting cable, video path, and fiber optic lines for the associated one cable and status indicators for the test points. A multi-position switch is mounted on the enclosure with the switch selectable for a plurality of periscope mast types.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

The Submarine High Data Rate (SHDR) dip loop cable is an outboard electrical cable linking a mast to an electrical hull fitting. During operations, the dip loop cable develops z-kinks in some of the conductors, which eventually lead to open circuit breaks and system failure.

A breakout box is provided to improve the process of measuring voltages supplied by inboard electronics and to check the integrity of dip loop fiber optic and radio frequency cables in preparation for a photonics periscope installation. There should be no voltages coming from any inboard electronics that could damage a multi-million dollar mast when the mast connects to the cables.

The breakout box of the present invention provides an easier and safer method of accessing the conductors in the dip loop cable by fanning such conductors out from the nested bundle inside the dip loop connector to a panel with an array of test points. The breakout box also provides access to the fiber optic cables at a remote connection point; thereby, ensuring the dip loop fibers are not touched when verifying integrity and continuity of the dip loop fibers.

Video injection points are provided on the breakout box to test the video paths through the dip loop to internal electronics. The dip loop cable has four radio frequency conductors in each cable but the cables are not brought through to the breakout box. Instead, testing is done using separate conductors provided at an interface cable.

Figure 1:
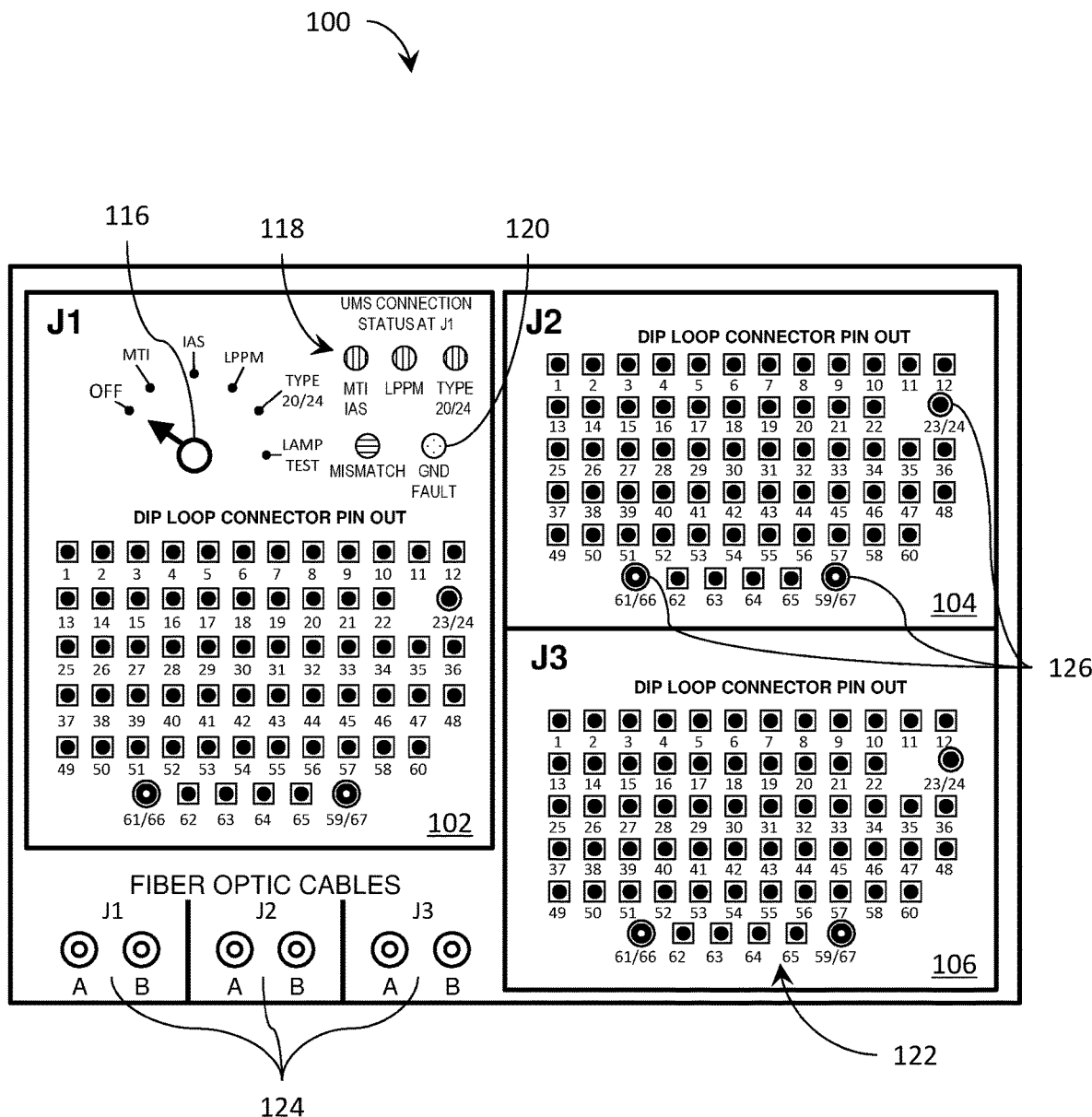
FIG. 1 illustrates a faceplate layout of a breakout box according to the present invention.

FIG. 1 depicts a breakout box of the present invention. An enclosure 100 of the breakout box defines a box of approximately 10"×13"×2". The dimensions are tall enough to accommodate mounting connectors on at least one side and wide enough to accommodate test panels. The breakout box has a plurality of interface panels 102, 104, 106 (indicated for the dip loop J1, J2, and J3 cables) mounted on the face of the enclosure 100.

Figure 2:
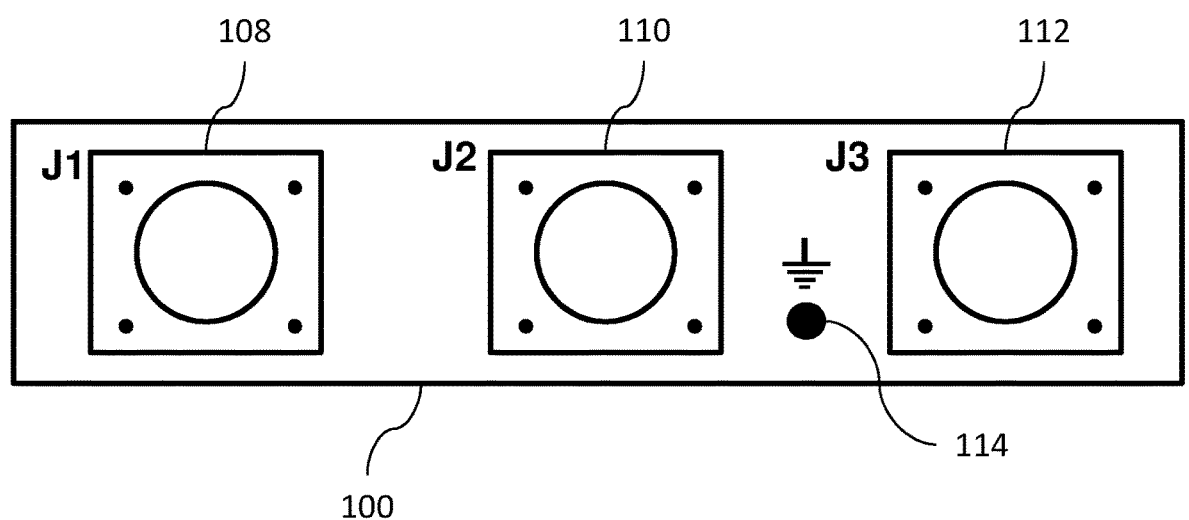
FIG. 2 illustrates a chassis connector layout.

As shown in FIG. 2, the enclosure 100 has connectors 108, 110, 112 (similarly indicated for the J1, J2, and J3 cables) for one or more cables from a periscope mast on a side of the enclosure. The connectors 108, 110, 112 align with the dip loop cables J1, J2, and J3. A ground lug 114 connects the enclosure 100 to ground. The connectors allow testing of all signals and connections at once for all of the dip loop cables.

Each cable includes copper conductors, fiber optic lines, radio frequency (RF) lines, and video lines. A multi-position switch 116 mounts on the enclosure 100. The multi-position switch 116 is selectable to accommodate one of a plurality of periscope mast types, such as the Mast Technical Insertion (MTI) Mast TI-16, the Integrated Submarine Imaging System (ISIS) Augmented System Low Profile Mast (IAS), the Low Profile Photonics Mast (LPPM), and a Type 20A/20B.

The interface panel 102 includes status indicator lights 118 at the section labeled "UMS Connection Status at J1". Warning lights indicate an incorrect configuration of the internal equipment. Voltage monitoring circuitry monitors voltage on four ground connections for operator safety as well as the integrity of the internal equipment. A ground fault indicator 120 will light if the voltage monitor detects more than approximately 0.5 volts. A lamp test position of the multi-position switch 116 can verify the integrity of the lamps. A pattern of voltage test points 122 on the enclosure 100 is shown with the pattern modifiable to accommodate extra space.

The enclosure 100 includes sixty-five copper test points 122 and two fiber optic conductors 124 for each connector (J1, J2, and J3). The J1 cable attaches to the connector 108 and is associated with the interface panel 102. The J2 cable attaches to the connector 110 and is associated with the interface panel 104. The J3 cable attaches to the connector 112 and is associated with the interface panel 106.

Figure 3:
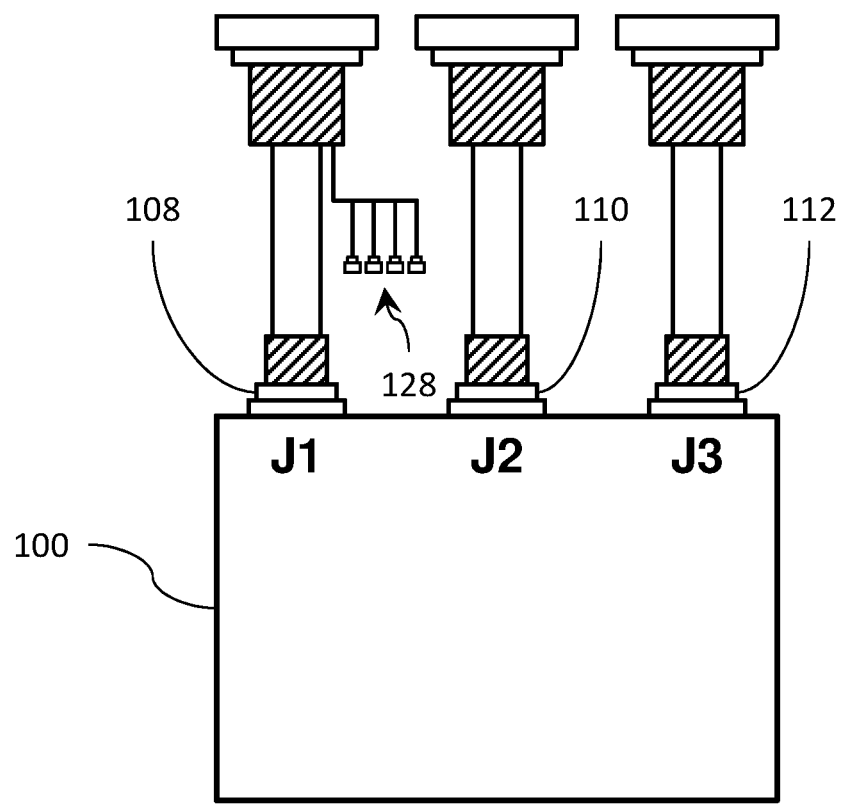
FIG. 3 illustrates a breakout box with interface cable connectors according to the present invention.

FIG. 3 shows the dip loop cables J1, J2, and J3 connected to the enclosure 100. The three cables (J1, J2, and J3) are identical and are used for operation. The J1 cable provides power to the enclosure 100; the J2 cable provides power to a Mission Critical Camera (MCC) and MCC Heater Head Window Sensor resistor jumper for the MTI mast; and the J3 cable has the mast identifying loop-back jumpers and the Oil Heater sensor resister jumper.

Each dip loop cable J1, J2, J3 has sixty-five copper conductors, two single-mode fiber optic connections, and four radio-frequency conductors. As illustrated in the figure, with respect to cable J1, the radio frequency conductors are not brought through to the enclosure 100. Instead, testing is done using separate conductors 128 provided at the J1 interface cable.

The breakout box conducts voltage checks and verifies the integrity of imaging system conductors in the dip loop cables J1, J2, J3 for each time that a mast is changed. These checks verify the continuity and the configuration of the inboard electronics and proper voltage levels before connecting the mast to a submarine ship. Since the dip loop cables connect to the enclosure 100; the video conductors are tested by injecting a video stream at video test ports 126, indicated at points 23/24, 61/66, and 59/67 to test that video path. Integrity of the fiber optic cable can be verified at the fiber optic connectors points 124, labeled "A" and "B", for each connector.

When the multi-position switch 116 is set to the mast type, jumper wires that identify the mast type and the resistor-jumper connections (shown in Table 1) are established.

TABLE 1

| | CONNECTOR SELECT SWITCH POSITION | | |
|---|---|---|---|
| MAST SW | J1 | J2 | J3 |
| MTI | Power at pin 6 from Sensor Unit contact | 300Ω resistor pin 2 to 3 MCC + 15 VDC | Loopback pins 21 and 22 900Ω resistor pin 15 to 16 |
| IAS | Power at pin 6 from Sensor Unit contact | 300Ω resistor pin 2 to 3 | Loopback pins 21 to 49 900Ω resistor pin 15 to 16 |
| LPPM | Power at pin 6 from Sensor Unit contact | No Contact | Loopback pins 22 to 49 and 21 to 49 |
| TYPE 20/24 | No Contact (future use) | No Contact (future use) | No Contact (future use) |
| OFF | No Contact | No Contact | No Contact |

The multi-position switch 116 is a multi-wafer, six-position switch with one wafer for each cable (J1, J2, and J3), a switch position for each mast type, a Lamp Test position, and OFF. The multi-position switch 116 selects the mast type that will interface with the Universal Mast System (UMS) when doing the voltage checks. The switch performs two functions at each mast position. One function is providing loop-back connections that identify the mast to the UMS and provides resistive jumpers to the Heater Head Window and Oil Heater sensors in order to simulate a call for heat that will provide voltage to these test points.

Conductors not used (when the mast type is selected) are carried through to the interface panels 102, 104, 106 as a test point. For example, when in the LPPM position, J1 conductors 1/39 and 1/40 (which are used for MTI and LAS but not for LPPM) are available for testing at the interface panel 102. Similarly, for J2, pins 2/3 and for J3, pins 21/22, 15/16, and 21/49 (which are not used for LPPM) are available for testing at the interface panels 104 and 106, respectively.

The status indicator lights 118 provide feedback to the operator such that the functions associated with the loop-back jumper pattern of the multi-position switch 116 match the mast configuration at UMS.

The GND (Ground) FAULT light 120 monitors the ground integrity of the UMS Ground Fault, Electro-Optic (E/O) Safety Ground Fault, ESM (Electronic Warfare Support Measure) Safety RTN Ground Fault, and the Configuration RTN Ground Fault on the UMS to verify voltage level readings at the test points and are based on a zero voltage ground reference. The light will be lit if there is a trace voltage on the ground plane from these power sources. That is, the GND FAULT light 120 illuminates when a ground line voltage is greater than approximately 0.5 Volts. The ground reference locations for the Azimuth Power Drawer (APD), Sensor Power Drawer (SPD), and Mast Interface Controller (MIC) are shown in Table 2.

TABLE 2

| J1 | J2 | J3 |
|---|---|---|
| UMS Ground pin 43 (APD) E/O Safety Return at pin 49 (SPD) ESM Safety Return at pin 51 (SPD) | | CONFIG RTN (pin 13 MIC) |

MTI/IAS LIGHT: a status is provided when the dip loop cable connects to J1 and J3, the Mast Selector Switch is set to MTI or IAS, and the Sensor Unit powers on at the Mast Tab. Conductors at pins 6 and 7 on J1 normally provide 15 VDC to the High Definition Color Camera (HDCC) camera but are used here for power to the breakout box circuitry.

LPPM LIGHT: a status is provided when the breakout box is connected to J1 and J3, the Mast Selector Switch is set to LPPM, and the Sensor Unit is powered on at the Mast Tab. Conductors at pins 6 and 7 RTN of J1 normally provide a 28 VDC Power Bus B1 to the LPPM but are used for Breakout Box power.

TYPE 20/24 LIGHT: a status light to support future TI-20 and TI-24 masts.

MISMATCH: The MISMATCH light will illuminate if the mast selected at the multi-position switch 116 does not match the configuration at the UMS. When the ISIS Operator turns on the Sensor Unit at the Mast Tab GUI (Graphic User Interface), the following two conditions will cause a MISMATCH. First, if 28 VDC is present when the multi-position switch 116 is in the MTI or IAS position and second, if 15 VDC is present when the multi-position switch 116 is in the LPPM position. A mismatch condition at the UMS is indicated with blinking status lights. This mismatch happens when the multi-position switch 116 is OFF or if mast identification is not provided (i.e., loop back jumpers are not installed).

Some of the advantages of the present invention include a panel layout that provides ease of access to test conductors without restrictions. The test points 122 on the interface panels 102, 104, 106 are insulated to protect from pin-to-pin shorts during measurement. Previously, measurements inside the densely populated connector had a high risk of contact with adjacent pins; thereby, potentially causing a short circuit. Operator safety is provided by interaction with the breakout box test panel rather than with the exposed voltage-carrying pins inside the connector.

Furthermore, the periscope cable connector has fiber optic conductors that are frail and easily damaged by a sideways force during testing. That is, the fiber test points on the panel remove the risk of damage to the dip loop cable from operator interaction. If the pins are damaged, the breakout box rather than the dip loop is repaired. By testing the fiber optic conductors at the panel of the breakout box and if a fiber pin breaks; the breakout box is sent for repair rather than the periscope cable.

The breakout box enables improved cable testing. A periscope cable consists of three different types of conductors. Each conductor type requires a different type of verification test. These tests were previously done separately.

The breakout box allows testing of the copper, fiber optic, and radio frequency (RF) conductors using the one device and set of interface cables, such that the three dip loop connectors can be tested with one setup; thereby, reducing test time. The multi-position switch 116 allows the device to be used with three different photonics mast types and automatically inserts jumper wires and jumper resistors between pins for test setup according to the type of mast selected.

The invention has been described with reference to specific embodiments. While particular values, relationships, materials, and steps have been set forth for purposes of describing concepts of the present disclosure, it will be appreciated by persons skilled in the art that numerous variations and/or modifications may be made to the invention as shown in the disclosed embodiments without departing from the spirit or scope of the basic concepts and operating principles of the invention.

What is claimed is:

1. A device for verifying that inboard electronics of a submarine are ready and safe to receive a periscope as well as verifying the integrity of the submarine periscope cables, said device compromising:
    an enclosure having cable connectors for a plurality of cables from a periscope mast, each of said plurality of cables from a group of voltage conducting wires, fiber optic lines, and video lines;
    a plurality of interface panels mounted on said enclosure, each said interface panel associated with one cable of said plurality of cables wherein each said interface panel includes test points for each voltage conducting wire, video path, and fiber optic line for the associated cable of said plurality of cables; and
    a multi-position switch mounted on said enclosure, said multi-position switch selectable for one of a plurality of periscope mast types wherein said multi-position switch inserts mast identifying loop-back jumpers and jumper resistors between pins for test setup according to the type of mast selected.

2. The device of claim 1, wherein said multi-position switch provides resistive jumpers to the periscope Head Window Heater and Oil Heater sensors by providing voltage to appropriate test points to simulate a call for heat.

3. The device of claim 2, further comprising status indicator lights to provide feedback to an operator such that functions associated with said multi-position switch match a mast configuration.

4. The device of claim 3, further comprising warning lights to indicate an incorrect configuration of internal equipment.

5. The device of claim 4, wherein said enclosure is powered by one of said cables.

6. The device of claim 5, further comprising a ground lug to connect said enclosure to ground.

7. The device of claim 6, wherein said video conductors are tested by inserting a video stream at designated video test ports on said enclosure.

8. The device of claim 7, wherein an integrity of said fiber optic cable is verifiable at designated test points on said enclosure.

9. The device of claim 8, wherein an integrity of a ground voltage monitoring circuit is verifiable with status lights.

\* \* \* \* \*